United States Patent
Deng et al.

(10) Patent No.: US 10,466,297 B2
(45) Date of Patent: Nov. 5, 2019

(54) DETECTION POINTS OF A PRINTED CIRCUIT BOARD TO DETERMINE ELECTRICAL PARAMETER OF AN INTEGRATED CIRCUIT

(71) Applicant: HUAWEI TECHNOLOGIES CO., LTD., Shenzhen, Guangdong (CN)

(72) Inventors: Jianping Deng, Shenzhen (CN); Cheng Zeng, Shenzhen (CN); Qingsong Zhu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 108 days.

(21) Appl. No.: 15/663,002

(22) Filed: Jul. 28, 2017

(65) Prior Publication Data

US 2017/0328950 A1    Nov. 16, 2017

Related U.S. Application Data

(63) Continuation of application No. PCT/CN2016/073073, filed on Feb. 1, 2016.

(30) Foreign Application Priority Data

Jan. 30, 2015   (CN) .......................... 2015 1 0052924

(51) Int. Cl.
   *G01R 31/08*   (2006.01)
   *G01R 31/28*   (2006.01)
   (Continued)

(52) U.S. Cl.
   CPC .......... *G01R 31/2884* (2013.01); *G01B 7/20* (2013.01); *G01R 27/08* (2013.01); *G01R 31/28* (2013.01); *G01R 31/3183* (2013.01)

(58) Field of Classification Search
   CPC ...... G01R 31/04; G01R 31/00; G01R 15/125; G01R 19/0092; G01R 27/08; G01R 27/16;
   (Continued)

(56) References Cited

U.S. PATENT DOCUMENTS 5,068,604 A    11/1991  Van de Lagemaat
6,717,415 B2 *  4/2004  Sunter ............... G01R 31/2812
                                                     324/519

(Continued)

FOREIGN PATENT DOCUMENTS

CN    2577288 Y    10/2003
CN    2629046 Y    7/2004
   (Continued)

OTHER PUBLICATIONS

International Search Report dated May 6, 2016 in corresponding International Patent Application No. PCT/CN2016/073073.

(Continued)

*Primary Examiner* — Vinh P Nguyen
(74) *Attorney, Agent, or Firm* — Staas & Halsey LLP

(57) ABSTRACT

An integrated circuit detection method, apparatus, and system are disclosed, which relate to the field of electronics and resolve a problem of detecting an electrical parameter of an integrated circuit on a printed circuit board in a power-on state. A specific solution is as follows: N detection circuits (101) are disposed, where each detection circuit (101) is connected to a different integrated circuit (102), the detection circuit (101) is provided with a first detection point (a) and a second detection point (b), and the detection circuit (101) is configured to detect the electrical parameter of the integrated circuit (102) that is connected to the detection circuit (101); and N is an integer greater than or equal to 1. The solution is used in a process of detecting the electrical parameter of the integrated circuit on the printed circuit board.

19 Claims, 16 Drawing Sheets

(51) Int. Cl.
*G01B 7/16* (2006.01)
*G01R 27/08* (2006.01)
*G01R 31/3183* (2006.01)

(58) Field of Classification Search
CPC ............ G01R 27/2605; G01R 27/2611; G01R 31/28; G01R 31/2853; G01R 31/3004; G01R 31/312; G01R 31/3167; G01R 31/317; G01R 31/3183; G01R 3/00; G01R 31/2884; G06F 13/4081; G06F 1/3206; G01B 7/20
See application file for complete search history.

(56) References Cited

U.S. PATENT DOCUMENTS

| | | | |
|---|---|---|---|
| 7,516,027 B2 * | 4/2009 | Sutardja | G01R 31/2884 365/149 |
| 2002/0125906 A1 | 9/2002 | Shaffroth et al. | |
| 2005/0093561 A1 | 5/2005 | Watanable et al. | |
| 2007/0103351 A1 | 5/2007 | Sutardja | |
| 2012/0161808 A1 | 6/2012 | Elias | |
| 2013/0049792 A1 | 2/2013 | Xue | |
| 2013/0161808 A1 | 6/2013 | Kim et al. | |
| 2013/0328588 A1 | 12/2013 | Shu et al. | |

FOREIGN PATENT DOCUMENTS

| | | |
|---|---|---|
| CN | 201215580 Y | 4/2009 |
| CN | 101484863 A | 7/2009 |
| CN | 103472347 A | 12/2013 |
| CN | 104635141 A | 5/2015 |
| EP | 2038720 | 1/2008 |
| JP | 2000-19212 | 1/2000 |
| JP | 2005-100332 | 4/2005 |
| WO | 2008/005112 A2 | 1/2008 |

OTHER PUBLICATIONS

Written Opinion of the International Searching Authority dated May 6, 2016 in corresponding International Patent Application No. PCT/CN2016/073073.
Chinese Office Action dated Feb. 4, 2017 in corresponding Chinese Patent Application No. 201510052924.0.
International Search Report dated May 6, 2016 in corresponding International Application PCT/CN2016/073073.
Extended European Search Report dated Dec. 21, 2017 in corresponding European Patent Application No. 16742817.6.

* cited by examiner

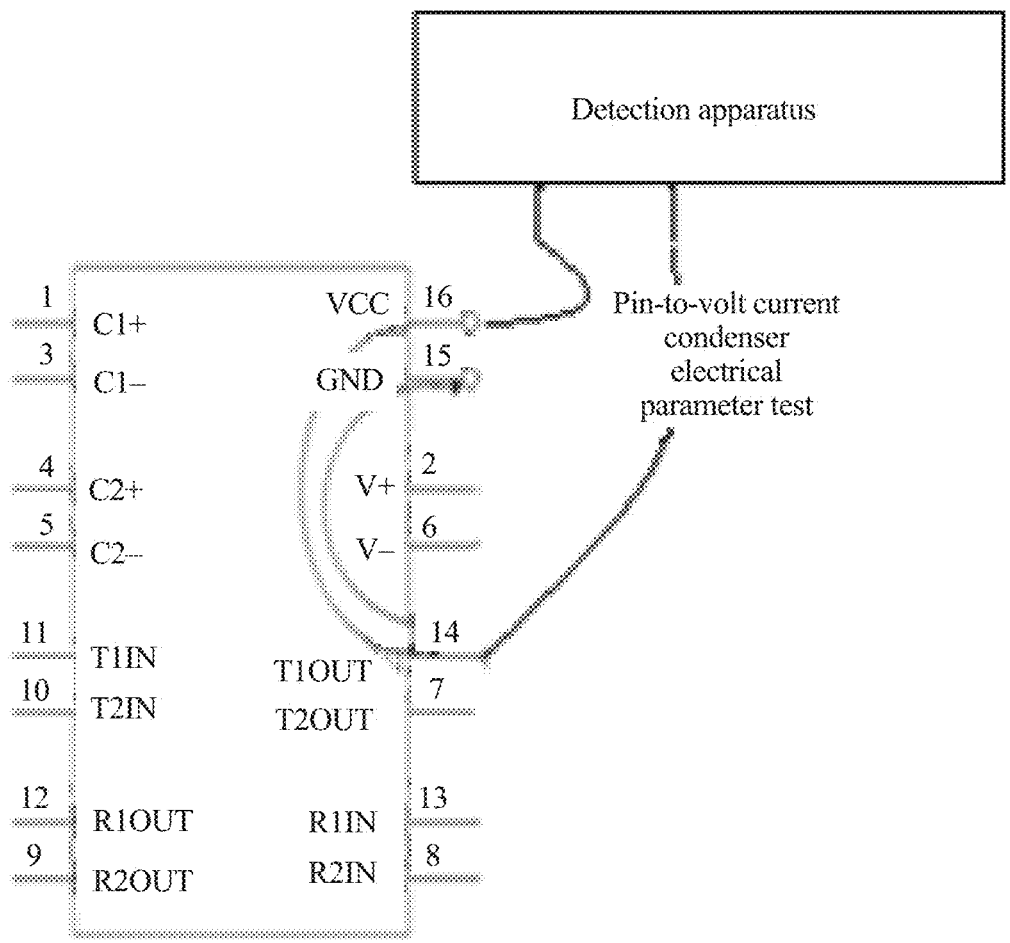
FIG. 10a1

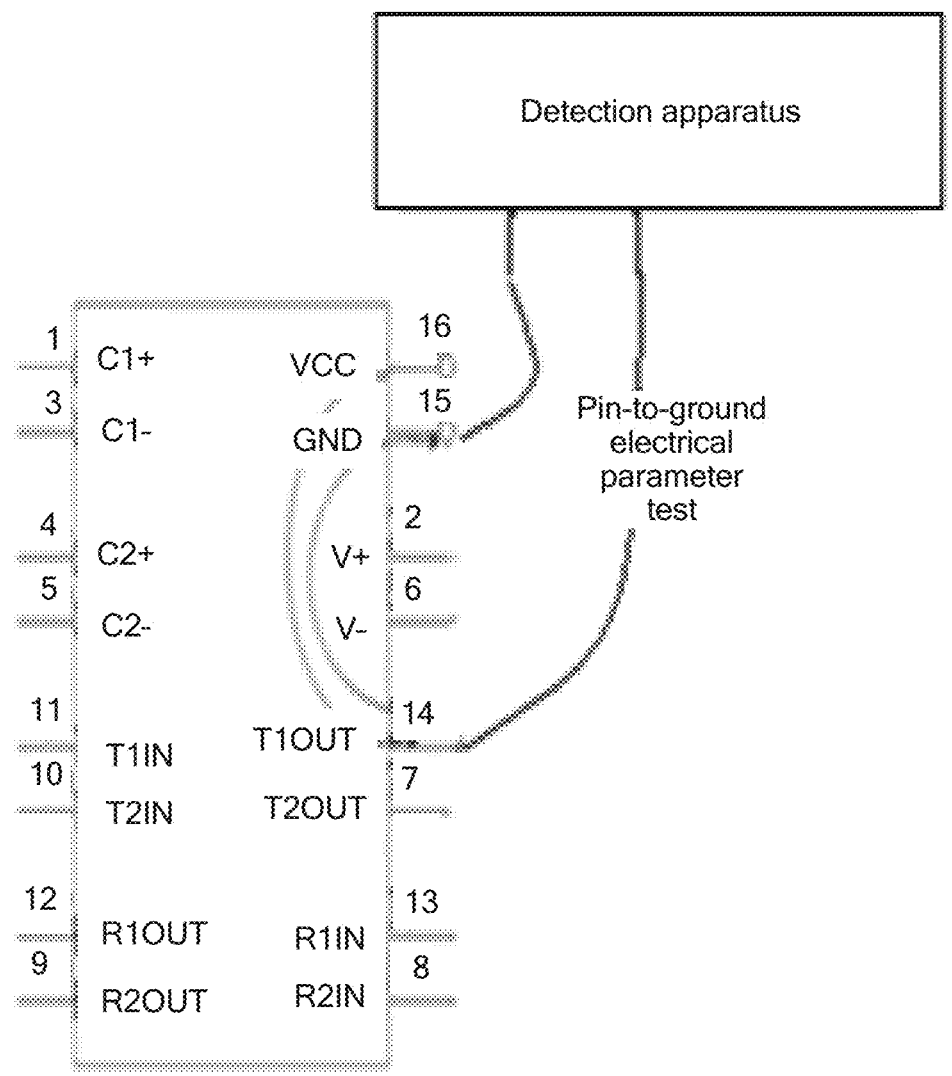
FIG. 10b1

DETECTION POINTS OF A PRINTED CIRCUIT BOARD TO DETERMINE ELECTRICAL PARAMETER OF AN INTEGRATED CIRCUIT

CROSS-REFERENCE TO RELATED APPLICATIONS

This application is a continuation of International Application No. PCT/CN2016/073073, filed on Feb. 1, 2016, which claims priority to Chinese Patent Application No. 201510052924.0, filed on Jan. 30, 2015. The disclosures of the aforementioned applications are hereby incorporated by reference in their entireties.

TECHNICAL HELD

The present invention relates to the field of electronics, and in particular, to an integrated circuit detection method, apparatus, and system.

BACKGROUND

A printed circuit board (PCB) integrates various integrated circuits (integrated circuit, IC) to implement a specific function. Generally, a detection technology that integrates board function detection and channel function detection is mainly used to detect, on the printed circuit board, a potential quality hazard of an integrated circuit. Detection software may be embedded in the printed circuit board. The embedded detection software actuates the printed circuit board, and a detection meter or the printed circuit board receives a detection result. Alternatively, a detection meter may actuate the printed circuit board, and the detection meter or the printed circuit board receives a detection result, so as to determine, by detecting a functional failure of the printed circuit board, whether an electrical parameter of the integrated circuit on the printed circuit board or in a specific channel of the printed circuit board is abnormal, and whether the potential quality hazard exists in the integrated circuit. The board is the printed circuit board. Detecting an integrated circuit on a printed circuit board is referred to as on-board integrated circuit detection.

However, in the prior art, only a functional failure of a printed circuit board or a channel-level functional failure of a printed circuit board can be detected, and a quality problem of a specific integrated circuit on the printed circuit board cannot be detected. Consequently, an electrical parameter of the integrated circuit cannot be accurately detected; when a function of the printed circuit board is normal, a potential quality hazard caused by an abnormal electrical parameter of the integrated circuit cannot be identified.

SUMMARY

Embodiments of the present invention provide an integrated circuit detection method, apparatus, and system, so as to detect an electrical parameter of an integrated circuit on a printed circuit board in a power-on state.

To achieve the foregoing objective, the following technical solutions are used in the embodiments of the present invention.

A first aspect of the embodiments of the present invention provides a printed circuit board, including:

N detection circuits, where each detection circuit is connected to a different integrated circuit, and the detection circuit is provided with a first detection point and a second detection point, where the first detection point and the second detection point are connected to a detection meter that is configured to perform electrical parameter detection, so that the detection meter obtains a first electrical parameter by using the first detection point and the second detection point, and determines, according to the first electrical parameter, whether an electrical parameter of the integrated circuit connected to the detection circuit is normal; and N is an integer greater than or equal to 1, and the electrical parameter includes at least one of a total current, an on-resistance, or a voltage.

With reference to the first aspect, in a first possible implementation manner, the first detection point is connected to a volt current condenser of the printed circuit hoard that supplies power to the integrated circuit, and the second detection point is connected to a volt current condenser pin of the integrated circuit; or the first detection point is connected to a function pin of the integrated circuit, and the second detection point is connected to a peripheral circuit of the integrated circuit.

With reference to the first aspect or the first possible implementation manner, in a second possible implementation manner, the detection circuit includes at least one resistor, or at least one bead, or at least one inductor.

With reference to the second possible implementation manner, in a third possible implementation manner, when the detection circuit includes a resistor, a first end of the resistor is the first detection point, and a second end of the resistor is the second detection point.

With reference to the third possible implementation manner, in a fourth possible implementation manner, when the detection circuit includes the bead or the inductor, a first end of the bead is the first detection point, and a second end of the bead is the second detection point.

A second aspect of the embodiments of the present invention provides a detection apparatus, including:

a detection control module, configured to set a detection state of a detection meter, where the detection apparatus includes the detection meter; and the detection control module is further configured to control the detection meter to connect to a first detection point and a second detection point that are of a detection circuit on a printed circuit board in a power-on state, where the first detection point and the second detection point are connected to the detection meter that is configured to perform electrical parameter detection, so that the detection meter obtains a first electrical parameter by using the first detection point and the second detection point, and a detection data processing module determines, according to the first electrical parameter, whether an electrical parameter of an integrated circuit connected to the detection circuit is normal; and N is an integer greater than or equal to 1;

the detection meter, configured to detect the detection circuit to obtain the first electrical parameter, where the first electrical parameter is the electrical parameter of the integrated circuit connected to the detection circuit; and the detection data processing module, configured to determine, according to the first electrical parameter, whether the electrical parameter of the integrated circuit connected to the detection circuit is normal.

With reference to the second aspect, in a first possible implementation manner, the detection data processing module is specifically configured to:

determine whether the first electrical parameter is within a first preset range, where the first preset range is a preset range of the electrical parameter of the integrated circuit connected to the detection circuit; and if the first electrical parameter is within the first preset range, determine that the electrical parameter of the integrated circuit connected to the detection circuit is normal; or if the first electrical parameter is not within the first preset range, determine that the electrical parameter of the integrated circuit connected to the detection circuit is abnormal.

With reference to the second aspect or the first possible implementation manner, in a second possible implementation manner, the detection control module is further configured to: control the detection meter to connect to a function pin and a volt current condenser pin that are of the integrated circuit, or control the detection meter to connect to a function pin and a ground pin that are of the integrated circuit;

the detection meter is further configured to detect the integrated circuit to obtain a second electrical parameter, where the second electrical parameter includes an electrical parameter of the function pin of the integrated circuit; and the detection data processing module is further configured to determine, according to the second electrical parameter, whether the electrical parameter of the function pin of the integrated circuit is normal.

With reference to the second possible implementation manner, in a third possible implementation manner, the detection data processing module is specifically configured to:

determine whether the second electrical parameter is within a second preset range, where the second preset range is a preset range of the electrical parameter of the function pin of the integrated circuit; and if the second electrical parameter is within the second preset range, determine that the electrical parameter of the function pin of the integrated circuit is normal; or if the second electrical parameter is not within the second preset range, determine that the electrical parameter of the function pin of the integrated circuit is abnormal.

With reference to any one of the second aspect, or the first to the third possible implementation manners of the second aspect, in a fourth possible implementation manner, the electrical parameter includes at least one of a total current, an on-resistance, or a voltage.

A third aspect of the embodiments of the present invention provides an integrated circuit detection method, including:

setting, by a detection apparatus, a detection state of a detection meter, where the detection apparatus includes the detection meter;

connecting, by the detection apparatus, to a first detection point and a second detection point that are of a detection circuit on a printed circuit board in a power-on state;

detecting, by the detection meter on the detection apparatus, the detection circuit to obtain a first electrical parameter, where the first electrical parameter is an electrical parameter of the integrated circuit connected to the detection circuit; and determining, by the detection apparatus and according to the first electrical parameter, whether the electrical parameter of the integrated circuit connected to the detection circuit is normal.

With reference to the third aspect, in a first possible implementation manner, the determining, according to the first electrical parameter, whether the electrical parameter of the integrated circuit connected to the detection circuit is normal includes:

determining whether the first electrical parameter is within a first preset range, where the first preset range is a preset range of the electrical parameter of the integrated circuit connected to the detection circuit; and if the first electrical parameter is within the first preset range, determining that the electrical parameter of the integrated circuit connected to the detection circuit is normal; or if the first electrical parameter is not within the first preset range, determining that the electrical parameter of the integrated circuit connected to the detection circuit is abnormal.

With reference to the third aspect or the first possible implementation manner, in a second possible implementation manner, the method further includes:

controlling, by the detection control module, the detection meter to connect to a function pin and a volt current condenser pin that are of the integrated circuit, or controlling the detection meter to connect to a function pin and a ground pin that are of the integrated circuit;

detecting, by the detection meter, the integrated circuit to obtain a second electrical parameter, where the second electrical parameter is an electrical parameter of the function pin of the integrated circuit; and determining, by the detection data processing module and according to the second electrical parameter, whether the electrical parameter of the function pin of the integrated circuit is normal.

With reference to the second possible implementation manner, in a third possible implementation manner, the determining, by the detection data processing module and according to the second electrical parameter, whether the electrical parameter of the function pin of the integrated circuit is normal includes:

determining whether the second electrical parameter is within a second preset range, where the second preset range is a preset range of the electrical parameter of the function pin of the integrated circuit; and if the second electrical parameter is within the second preset range, determining that the electrical parameter of the function pin of the integrated circuit is normal; or if the second electrical parameter is not within the second preset range, determining that the electrical parameter of the function pin of the integrated circuit is abnormal.

With reference to any one of the third aspect, or the first to the third possible implementation manners of the third aspect, in a fourth possible implementation manner, the electrical parameter includes at least one of a total current, an on-resistance, or a voltage.

A fourth aspect of the embodiments of the present invention provides a detection system, including any one of the foregoing printed circuit boards and any one of the foregoing detection apparatuses.

According to the integrated circuit detection method, apparatus, and system that are provided in the embodiments of the present invention, a detection circuit connected to an integrated circuit on a printed circuit board is disposed on the printed circuit board, and an electrical parameter of the integrated circuit connected to the detection circuit is detected by using the detection circuit, so as to determine, according to a first electrical parameter, whether the electrical parameter of the integrated circuit connected to the detection circuit is normal. This resolves a problem, in the prior art, that the electrical parameter of the integrated circuit on the printed circuit board cannot be detected when the printed circuit board is in a power-on state, so that the electrical parameter of the integrated circuit on the printed circuit board in the power-on state can be effectively detected.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and a person of ordinary skill in the art may still derive other drawings from these accompanying drawings without creative efforts.

FIG. 10a1 is a schematic circuit diagram of the specific detection system shown in FIG. 10a according to an embodiment of the present invention;

FIG. 10b1 is a schematic circuit diagram of the specific detection system shown in FIG. 10b according to an embodiment of the present invention.

DESCRIPTION OF EMBODIMENTS

The following clearly describes the technical solutions in the embodiments of the present invention with reference to the accompanying drawings in the embodiments of the present invention. Apparently, the described embodiments are merely some but not all of the embodiments of the present invention. All other embodiments obtained by a person of ordinary skill in the art based on the embodiments of the present invention without creative efforts shall fall within the protection scope of the present invention.

Embodiment 1

Figure 1:
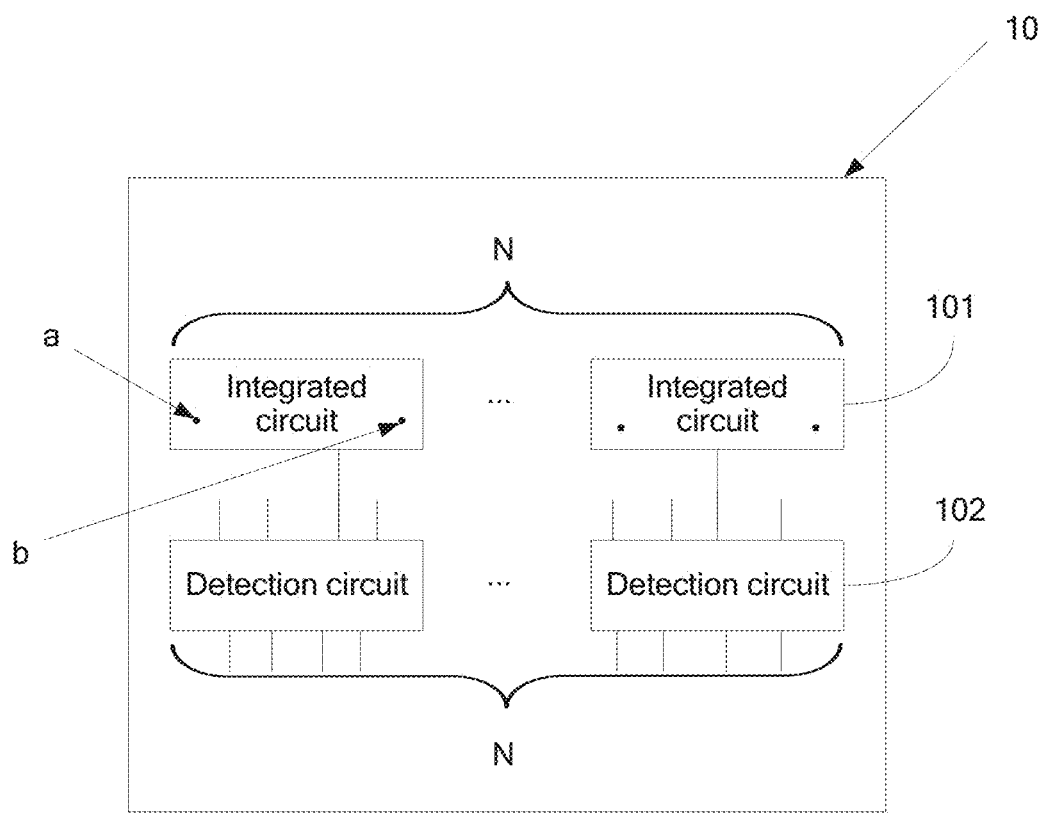
FIG. 1 is a schematic structural diagram of a printed circuit board according to an embodiment of the present invention.

An embodiment of the present invention provides a printed circuit board 10. As shown in FIG. 1, the printed circuit board 10 includes:

N detection circuits 101, where each detection circuit is connected to a different integrated circuit 102, the detection circuit is provided with a first detection point a and a second detection point b, and the detection circuit is configured to detect an electrical parameter of the integrated circuit connected to the detection circuit; and N is an integer greater than or equal to 1.

The first detection point and the second detection point are connected to a detection meter that is configured to perform electrical parameter detection, so that the detection meter obtains a first electrical parameter by using the first detection point and the second detection point, and determines, according to the first electrical parameter, whether the electrical parameter of the integrated circuit connected to the detection circuit is normal. The electrical parameter includes at least one of a total current, an on-resistance, or a voltage.

Therefore, a detection circuit connected to an integrated circuit on a printed circuit board is disposed on the printed circuit board, and an electrical parameter of the integrated circuit connected to the detection circuit is detected by using the detection circuit, so as to determine, according to a first detection result, whether the electrical parameter of the integrated circuit connected to the detection circuit is normal. This overcomes a problem, in the prior art, that the electrical parameter of the integrated circuit on the printed circuit board cannot be detected when the printed circuit board is in a power-on state, so that the electrical parameter of the integrated circuit on the printed circuit board in the power-on state can be effectively detected.

Figure 2:
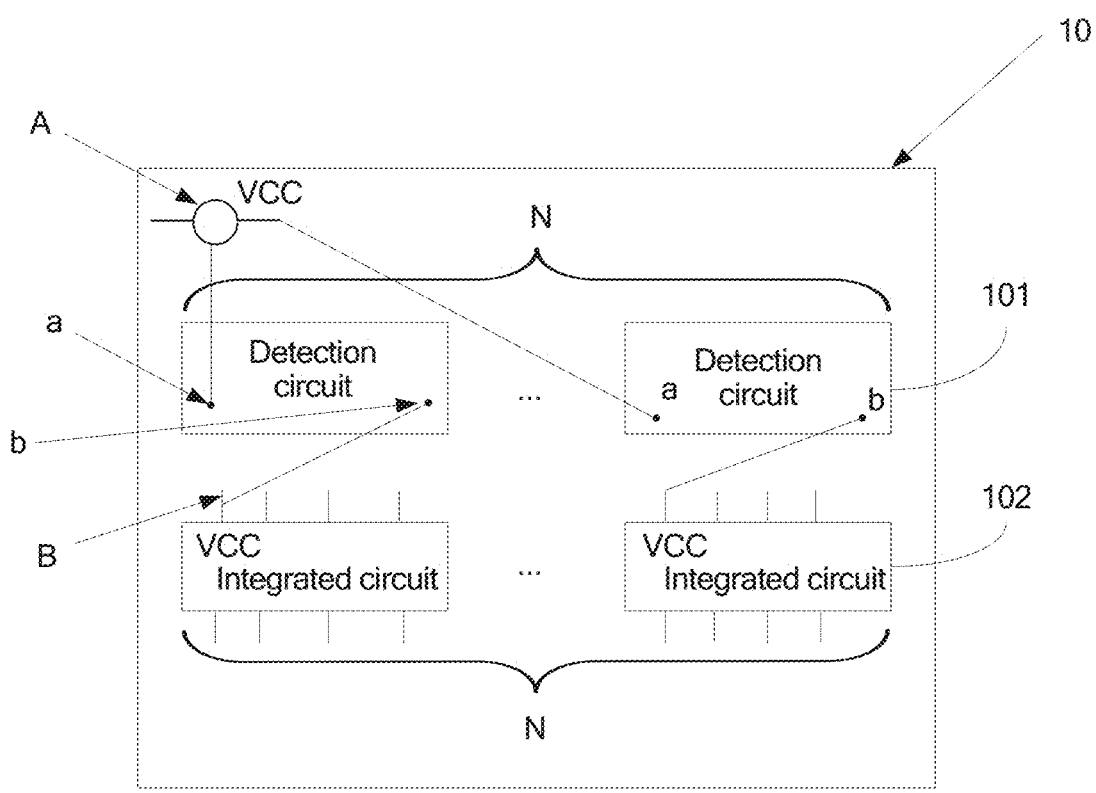
FIG. 2 is a schematic structural diagram of another printed circuit board according to an embodiment of the present invention.

Optionally, a method for connecting the detection circuit and the integrated circuit is shown in FIG. 2. The first detection point a is connected to a volt current condenser VCC pin A of the printed circuit board, and the second detection point b is connected to a volt current condenser (Volt Current Condenser, VCC) pin B of the integrated circuit. The VCC pin A is a volt current condenser pin of the printed circuit board that supplies power to the integrated circuit. For example, the VCC pin A may be a pin of a circuit that is on the printed circuit board and that provides a power supply, or a pin of an external volt current condenser that supplies power to the printed circuit board.

Figure 3:
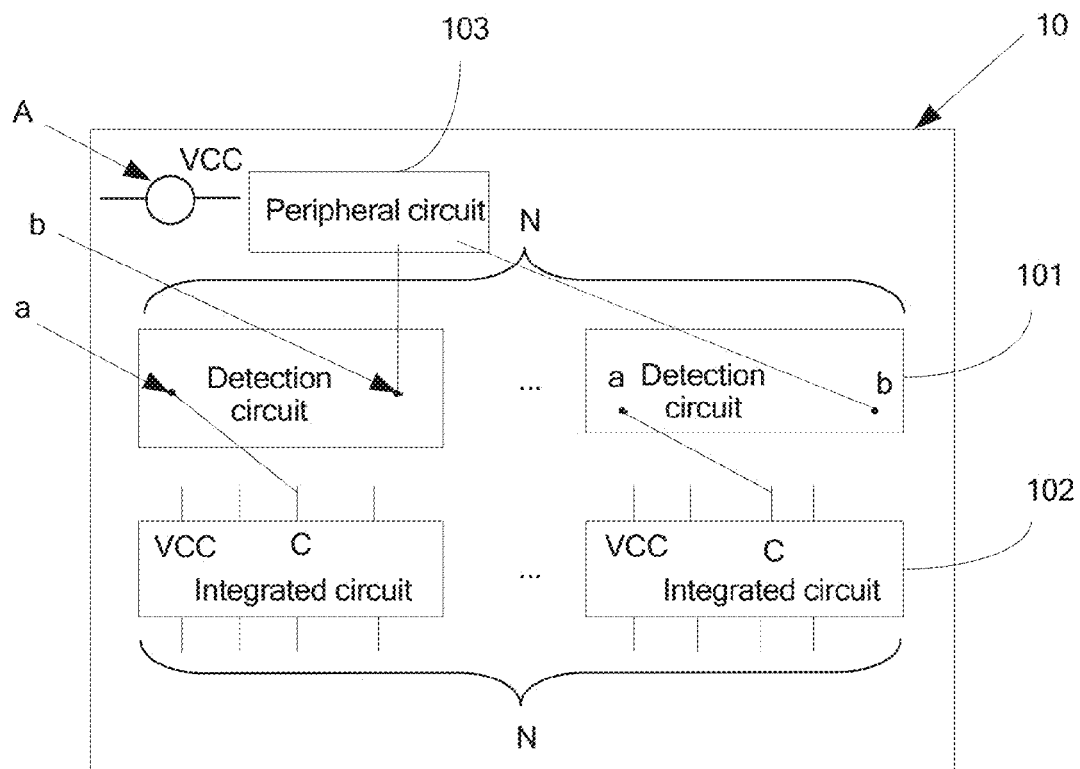
FIG. 3 is a schematic structural diagram of still another printed circuit board according to an embodiment of the present invention.

Optionally, as shown in FIG. 3, the first detection point a is connected to a function pin C of the integrated circuit, and the second detection point b is connected to a peripheral circuit 103 of the integrated circuit. Generally, the printed circuit board integrates various circuits. Different circuits have different functions, and the circuits are also connected to each other. The peripheral circuit may be another circuit on the printed circuit board.

It should be noted that the detection circuit includes at least one resistor, or at least one magnetic device, and the magnetic device is a bead or an inductor. When the detection circuit includes one resistor, a first end of the resistor is the first detection point, and a second end of the resistor is the second detection point. When the detection circuit includes at least two resistors, the resistors may be connected in a serial connection manner, or in a parallel connection manner, or in a hybrid manner combining serial connection and parallel connection. Likewise, when the detection circuit includes one bead, a first end of the bead is the first detection point, and a second end of the bead is the second detection point. When the detection circuit includes at least two beads, the beads may be connected in a serial connection manner, or in a parallel connection manner, or in a hybrid manner combining serial connection and parallel connection. When the detection circuit includes one inductor, a first end of the inductor is the first detection point, and a second end of the inductor is the second detection point. When the detection circuit includes at least two inductors, the inductors may be connected in a serial connection manner, or in a parallel connection manner, or in a hybrid manner combining serial connection and parallel connection.

Embodiment 2

Figure 4:
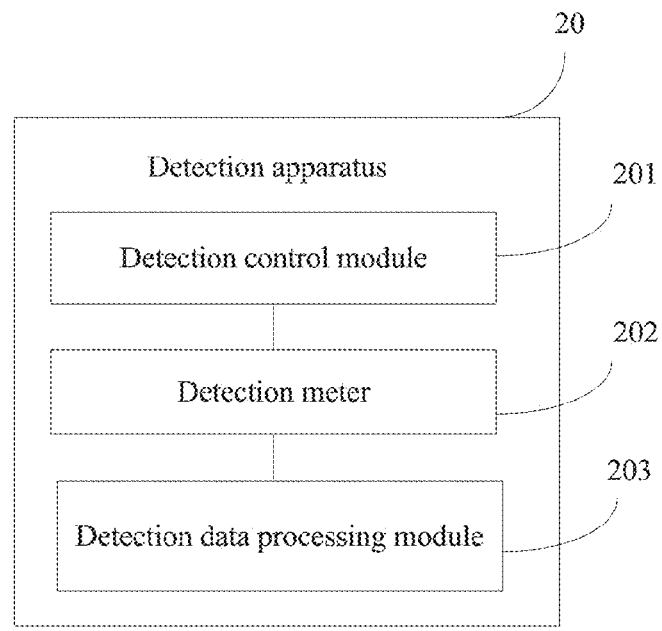
FIG. 4 is a schematic structural diagram of a detection apparatus according to an embodiment of the present invention.

An embodiment of the present invention provides a detection apparatus 20. As shown in FIG. 4, the detection apparatus 20 includes:

a detection control module 201, configured to set a detection state of a detection meter 202, where the detection apparatus includes the detection meter; and the detection control module 201 is further configured to control the detection meter to connect to a first detection point and a second detection point that are of a detection circuit on a printed circuit board in a power-on state, where the printed circuit board includes N detection circuits, each detection circuit is connected to a different integrated circuit, the detection circuit is provided with the first detection point and the second detection point, and the detection circuit is configured to detect an electrical parameter of the integrated circuit connected to the detection circuit; and N is an integer greater than or equal to 1, where the first detection point and the second detection point are connected to the detection meter that is configured to perform electrical parameter detection, so that the detection meter obtains a first electrical parameter by using the first detection point and the second detection point, and a detection data processing module determines, according to the first electrical parameter, whether the electrical parameter of the integrated circuit connected to the detection circuit is normal:

the detection meter 202, configured to detect the detection circuit to obtain a first detection result, where the first detection result includes the electrical parameter of the integrated circuit connected to the detection circuit and the detection data processing module 203, configured to determine, according to the first detection result, whether the electrical parameter of the integrated circuit connected to the detection circuit is normal, that is, determine, according to the first electrical parameter, whether the electrical parameter of the integrated circuit connected to the detection circuit is normal.

Therefore, a detection control module of a detection apparatus controls a detection meter to detect a detection circuit that is disposed on a printed circuit board and that is connected to an integrated circuit on the printed circuit board, and to detect, by using the detection circuit, an electrical parameter of the integrated circuit connected to the detection circuit, so as to determine, according to a first detection result, whether the electrical parameter of the integrated circuit connected to the detection circuit is normal. This overcomes a problem, in the prior art, that the electrical parameter of the integrated circuit on the printed circuit board cannot be detected when the printed circuit board is in a power-on state, so that the electrical parameter of the integrated circuit on the printed circuit board in the power-on state can be effectively detected.

The detection data processing module 203 is specifically configured to:

determine whether the first detection result is within a first preset range, where the first preset range is a preset range of the electrical parameter of the integrated circuit connected to the detection circuit; and if the first detection result is within the first preset range, determine that the electrical parameter of the integrated circuit connected to the detection circuit is normal; or if the first detection result is not within the first preset range, determine that the electrical parameter of the integrated circuit connected to the detection circuit is abnormal.

The detection control module 201 is further configured to control the detection meter to connect to a function pin and a volt current condenser pin that are of the integrated circuit, or a function pin and a ground pin that are of the integrated circuit, that is, control the detection meter to connect to the function pin and the volt current condenser pin that are of the integrated circuit, or control the detection meter to connect to the function pin and the ground pin that are of the integrated circuit.

The detection meter 202 is further configured to detect the integrated circuit to obtain a second detection result. The second detection result includes an electrical parameter of the function pin of the integrated circuit.

The detection data processing module 203 is further configured to determine, according to the second detection result, whether the electrical parameter of the function pin of the integrated circuit is normal.

The detection data processing module 203 is specifically configured to:

determine whether the second detection result is within a second preset range, where the second preset range is a preset range of the electrical parameter of the function pin of the integrated circuit; and if the second detection result is within the second preset range, determine that the electrical parameter of the function pin of the integrated circuit is normal; or if the second detection result is not within the second preset range, determine that the electrical parameter of the function pin of the integrated circuit is abnormal.

Figure 5:
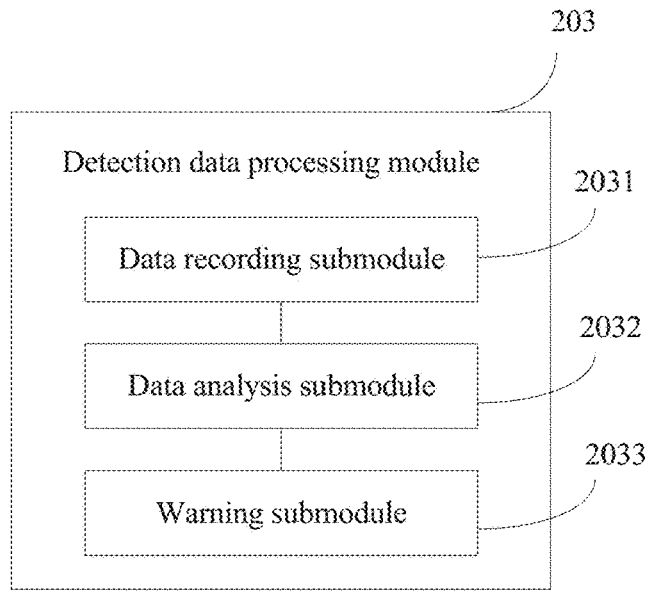
FIG. 5 is a schematic structural diagram of another detection apparatus according to an embodiment of the present invention.

As shown in FIG. 5, the detection data processing module may include a data recording submodule 2031, a data analysis submodule 2032, and a warning submodule 2033. The data recording submodule is configured to record the first detection result and the second detection result. The data analysis submodule is configured to: determine whether the first detection result is within the first preset range; if the first detection result is within the first preset range, determine that the electrical parameter of the integrated circuit connected to the detection circuit is normal, or if the first detection result is not within the first preset range, determine that the electrical parameter of the integrated circuit connected to the detection circuit is abnormal; and determine whether the second detection result is within the second preset range, where the second preset range is the preset range of the electrical parameter of the function pin of the integrated circuit; and if the second detection result is within the second preset range, determine that the electrical parameter of the function pin of the integrated circuit is normal, or if the second detection result is not within the second preset range, determine that the electrical parameter of the function pin of the integrated circuit is abnormal. The warning submodule is configured to send, to user equipment, a warning prompt of the first detection result and/or the second detection result obtained by the data analysis submodule.

It should be noted that the electrical parameter includes at least one of a total current, an on-resistance, or a voltage. For a specific description of sonic function modules in the detection apparatus provided in this embodiment of the present invention, refer to corresponding content in method embodiments, and details are not described in this embodiment.

Embodiment 3

Figure 6:
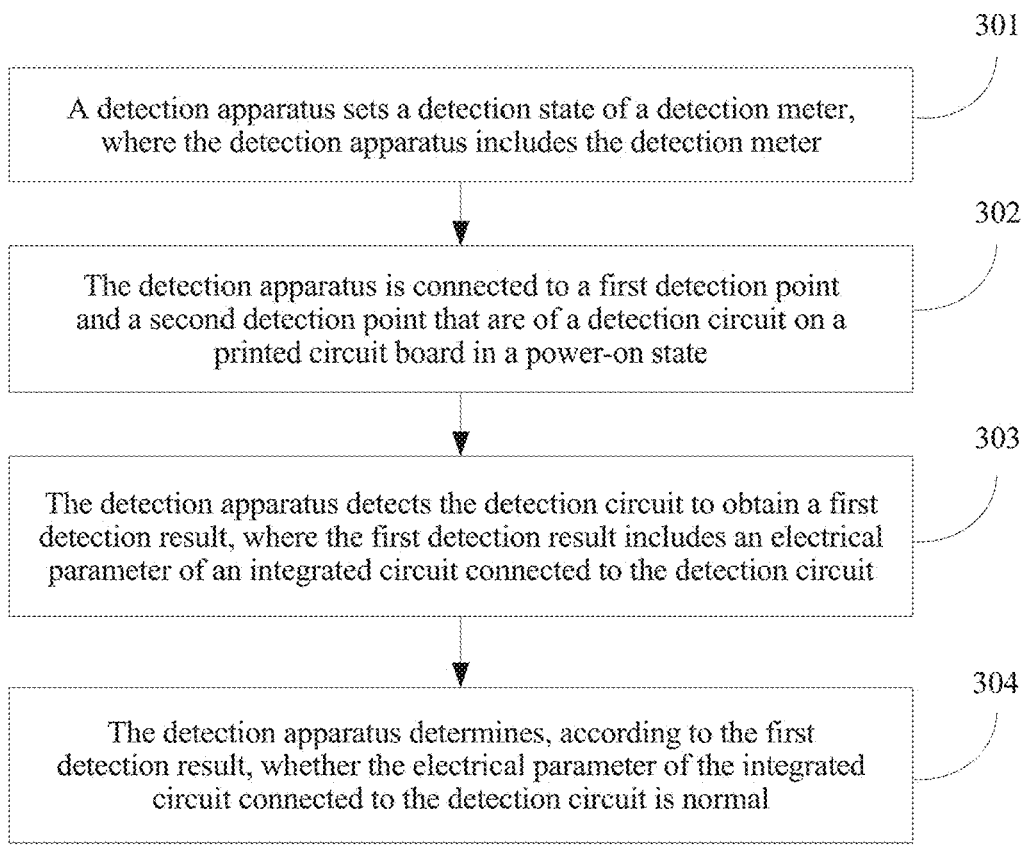
FIG. 6 is a flowchart of an integrated circuit detection method according to an embodiment of the present invention.

An embodiment of the present invention provides an integrated circuit detection method, which is applied in the printed circuit board shown in FIG. 1 and the detection apparatus shown in FIG. 4. As shown in FIG. 6, the method includes:

Step 301: The detection apparatus sets a detection state of a detection meter, where the detection apparatus includes the detection meter.

Step 302: The detection apparatus is connected to a first detection point and a second detection point that are of a detection circuit on the printed circuit board in a power-on state.

The printed circuit board includes N detection circuits. Each detection circuit is connected to a different integrated circuit. the detection circuit is provided with the first detection point and the second detection point, and the detection circuit is configured to detect an electrical parameter of the integrated circuit connected to the detection circuit. N is an integer greater than or equal to 1. The first detection point and the second detection point are connected to the detection meter that is configured to perform electrical parameter detection, so that the detection meter obtains a first electrical parameter by using the first detection point and the second detection point, and a detection data processing module determines, according to the first electrical parameter, whether the electrical parameter of the integrated circuit connected to the detection circuit is normal.

Step 303: The detection apparatus detects the detection circuit to obtain a first detection result, where the first detection result includes an electrical parameter of an integrated circuit connected to the detection circuit. The first detection result is a first electrical parameter.

Step 304: The detection apparatus determines, according to the first detection result, whether the electrical parameter of the integrated circuit connected to the detection circuit is normal.

According to the integrated circuit detection method provided in this embodiment of the present invention, a detection apparatus detects, by using a detection circuit, an electrical parameter of an integrated circuit connected to the detection circuit, and a detection circuit connected to the integrated circuit on a printed circuit board is disposed on the printed circuit board, so as to determine, according to a first detection result, whether the electrical parameter of the integrated circuit connected to the detection circuit is normal. This overcomes a problem, in the prior art, that the electrical parameter of the integrated circuit on the printed circuit board cannot be detected when the printed circuit board is in a power-on state, so that the electrical parameter of the integrated circuit on the printed circuit board in the power-on state can be effectively detected.

Embodiment 4

Figure 7A:
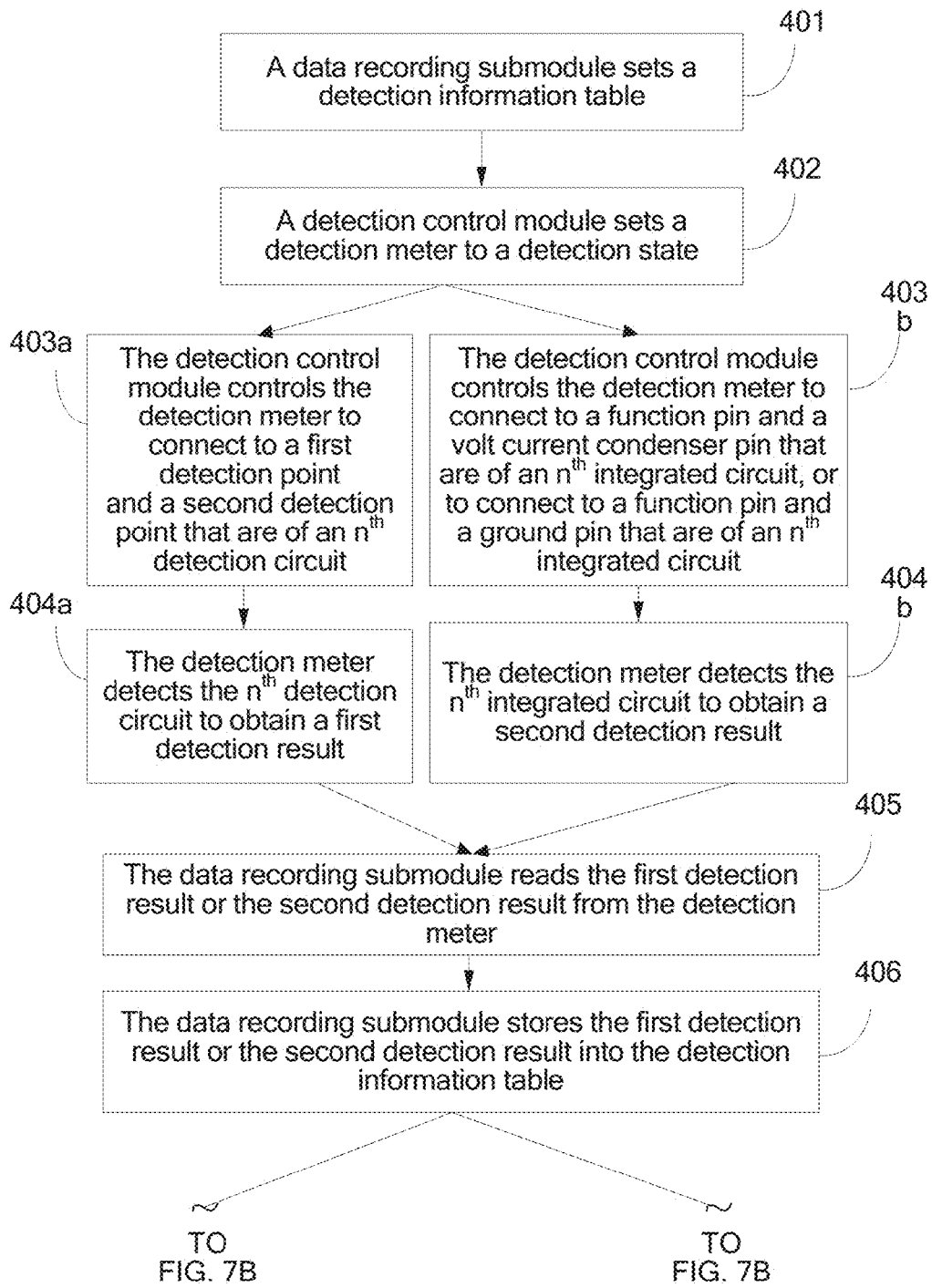
FIG. 7A to FIG. 7C are a flowchart of another integrated circuit detection method according to an embodiment of the present invention.
Figure 7B:
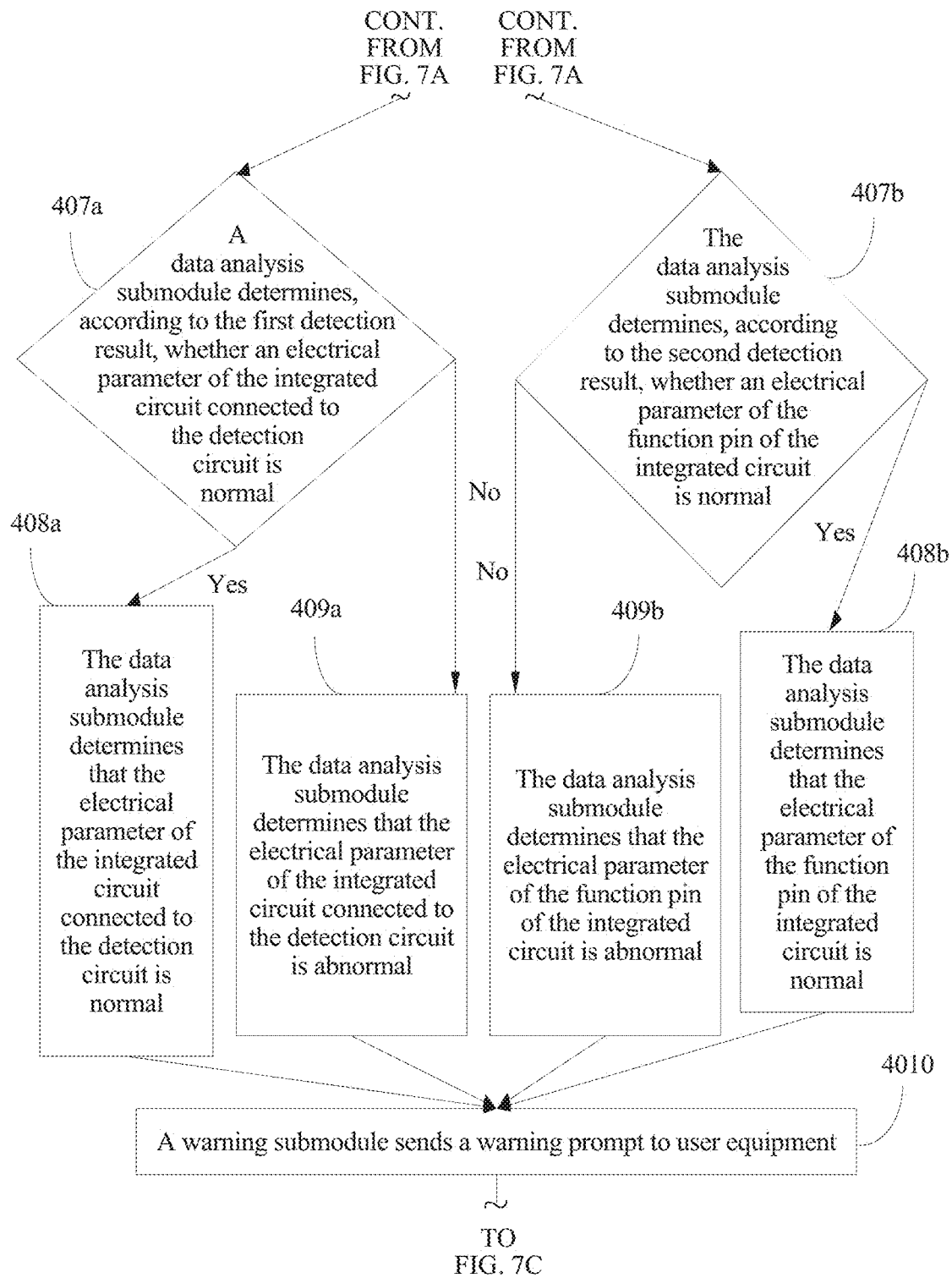
Figure 7C:
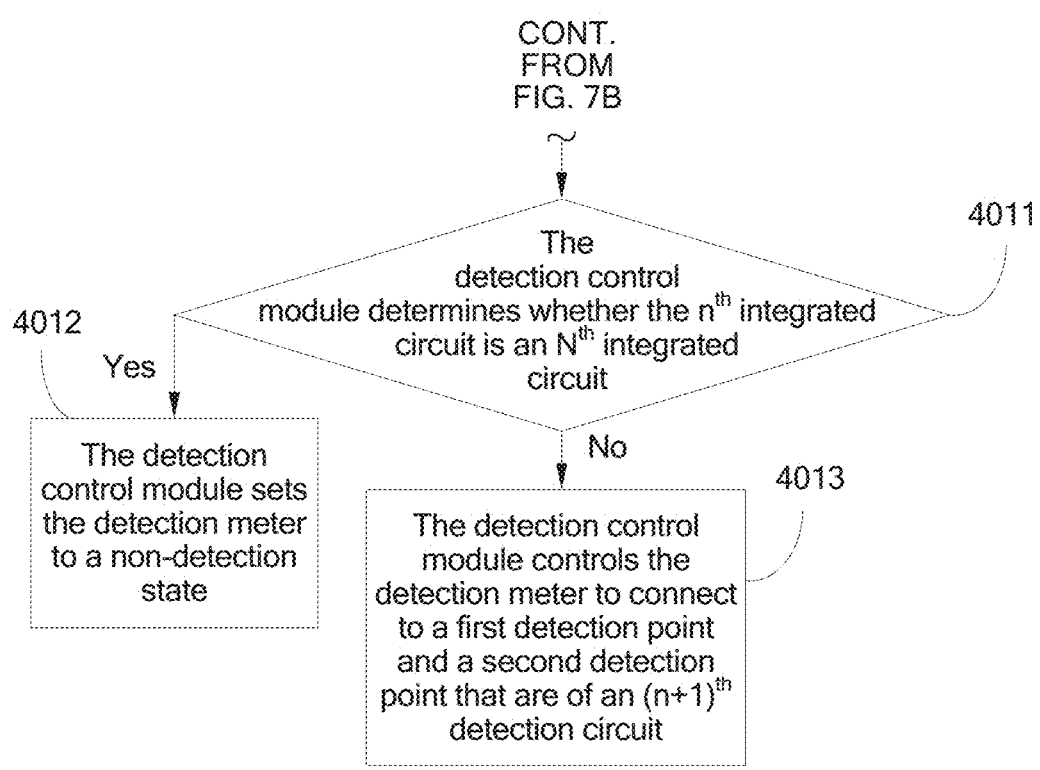

An embodiment of the present invention provides an integrated circuit detection method, which is applied in the printed circuit board shown in FIG. 1 and the detection apparatus shown in FIG. 4. The detection apparatus further includes a data recording submodule, a data analysis submodule, and a warning submodule. As shown in FIG. 7A to FIG. 7C, the method includes:

Step 401: The data recording submodule sets a detection information table.

The detection information table may include a name of a printed circuit board, a batch number of an integrated circuit, a model of the integrated circuit, a detection start moment, and a detection end moment. In an actual application, information such as a detection meter model may be further set.

Step 402: A detection control module sets a detection meter to a detection state.

Step 403a: The detection control module controls the detection meter to connect to a first detection point and a second detection point that are of an $n^{th}$ detection circuit.

n is an integer greater than or equal to 1 and less than or equal to N, and N is an integer greater than or equal to 1.

Figure 8:
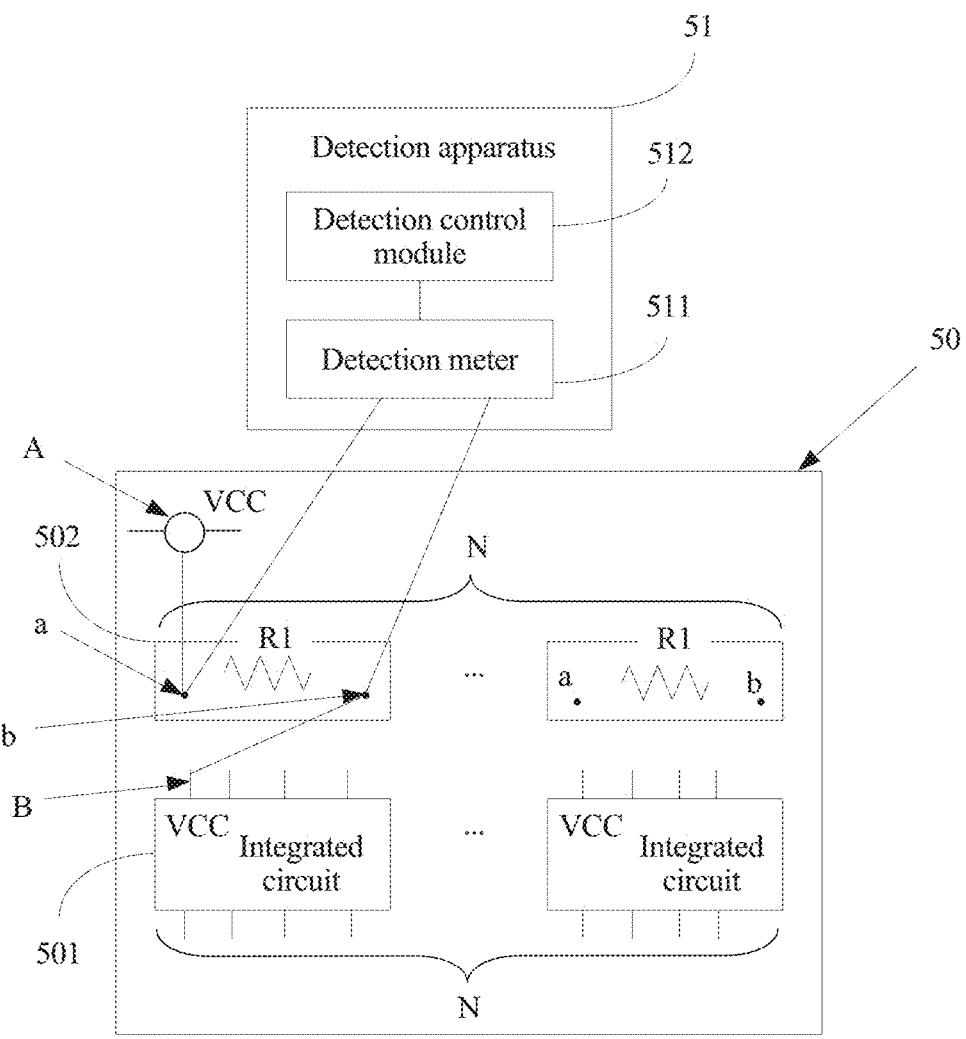
FIG. 8 is a schematic diagram of a detection system according to an embodiment of the present invention.
Figure 8A:
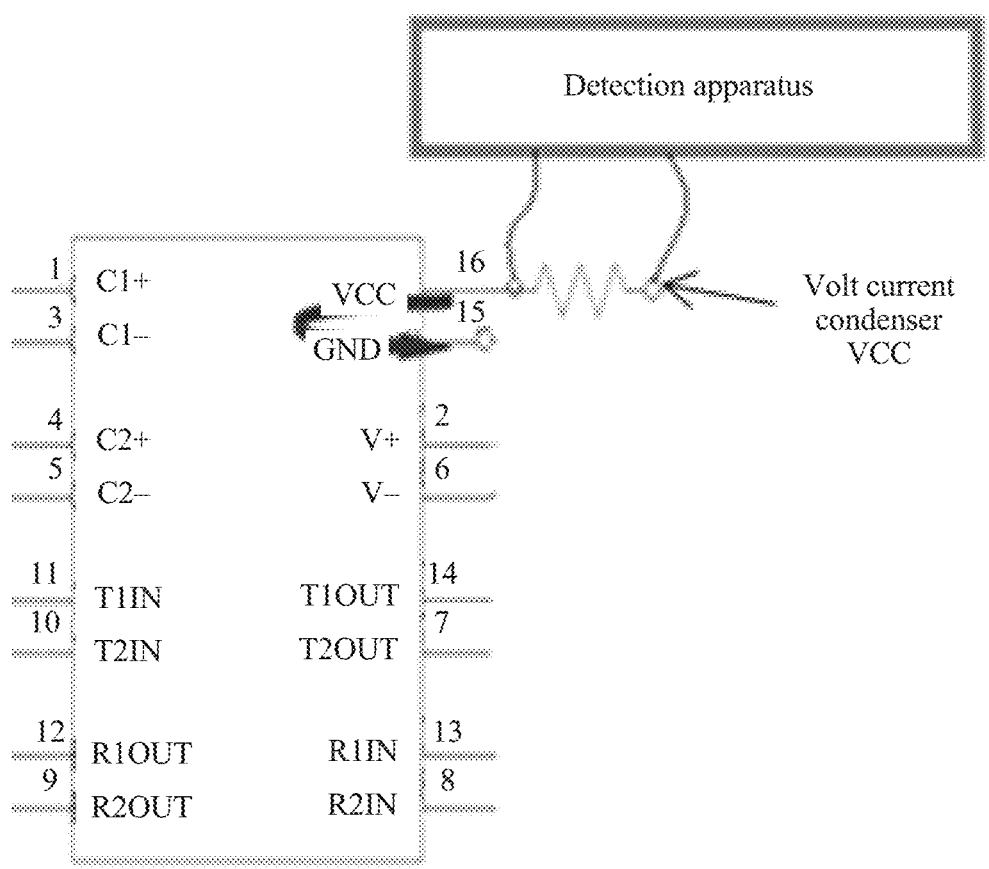
FIG. 8a is a schematic circuit diagram of the detection system according to an embodiment of the present invention.

For example, as shown in FIG. 8, it is assumed that the $n^{th}$ detection circuit is a first detection circuit 502 on a printed circuit board 50. A first detection point a of the first detection circuit is connected to a volt current condenser VCC pin A of the printed circuit board, and a second detection point b of the first detection circuit 502 is connected to a volt current condenser VCC pin B of a first integrated circuit 501. A detection control module 512 in a detection apparatus 51 controls a detection meter 511 to separately connect to the first detection point a and the second detection point b, and the detection circuit 502 includes a resistor R1. FIG. 8a is a specific circuit diagram of the detection system shown in FIG. 8.

Figure 9:
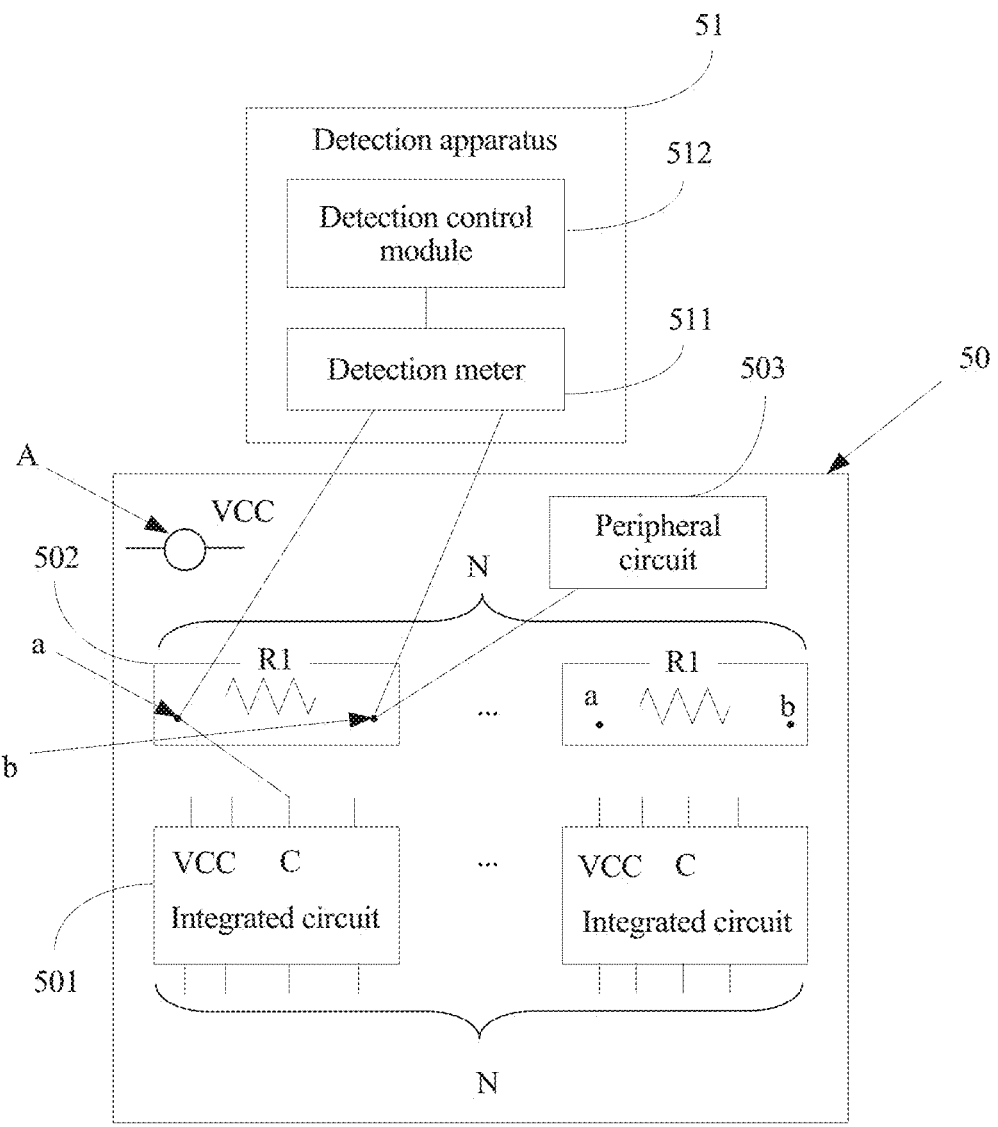
FIG. 9 is a schematic diagram of another detection system according to an embodiment of the present invention.

Optionally, as shown in FIG. 9, the first detection point a of the first detection circuit 502 is connected to a function pin C of the first integrated circuit 501, and the second detection point b of the first detection circuit 502 is connected to a peripheral circuit 503 of the first integrated circuit 501. The detection control module 512 in the detection apparatus 51 controls the detection meter 511 to separately connect to the first detection point a and the second detection point b, and the detection circuit 502 includes the resistor R1.

Step 403b: The detection control module controls the detection meter to connect to a function pin and a volt current condenser pin that are of an $n^{th}$ integrated circuit, or to connect to a function pin and a ground pin that are of an $n^{th}$ integrated circuit.

Figure 10:
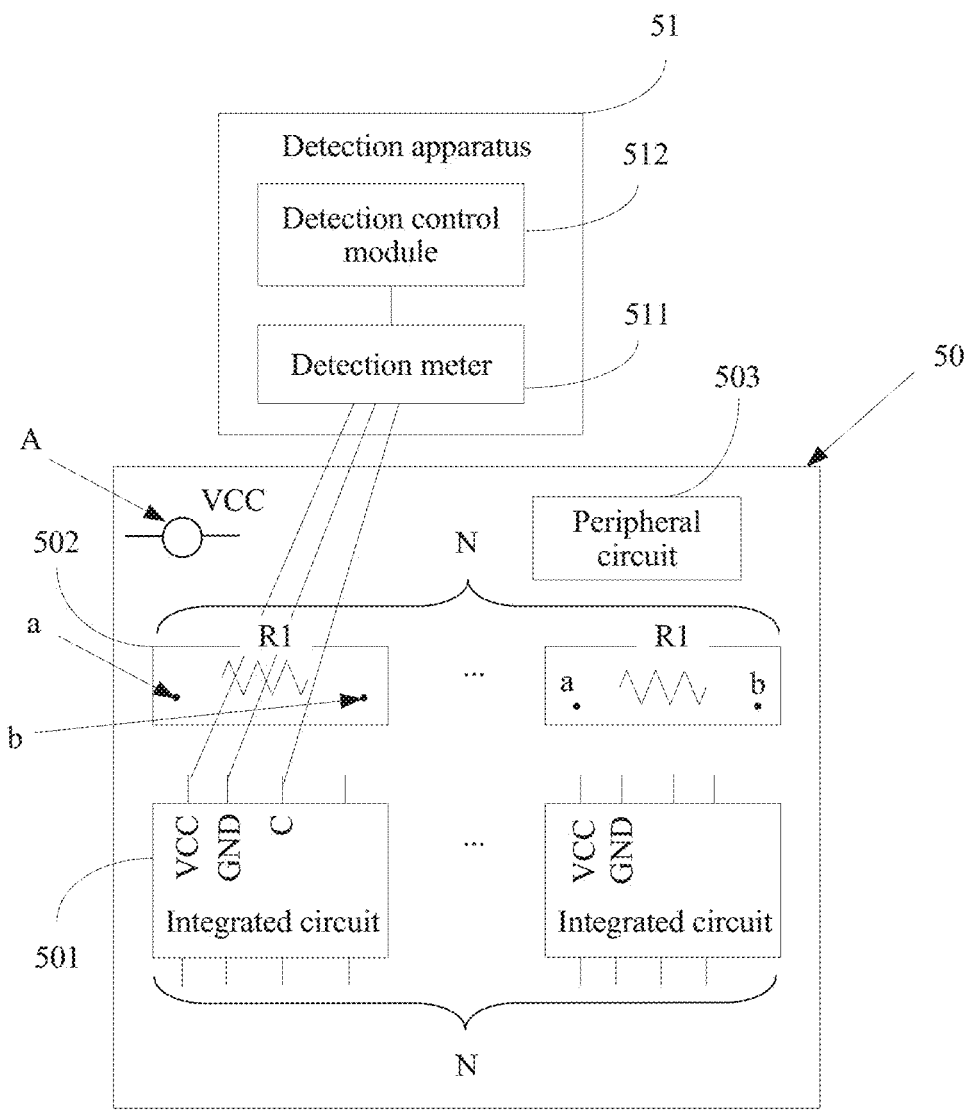
FIG. 10 is a schematic diagram of still another detection system according to an embodiment of the present invention.

For example, as shown in FIG. 10, it is assumed that the $n^{th}$ integrated circuit is the first integrated circuit 501 on the printed circuit board 50. The detection control module 512 in the detection apparatus 51 controls the detection meter 511 to connect to the function pin C and the volt current condenser pin VCC that are of the first integrated circuit 501, or to connect to the function pin C and the ground (Ground, GND) pin that are of the first integrated circuit 501.

Figure 10A:
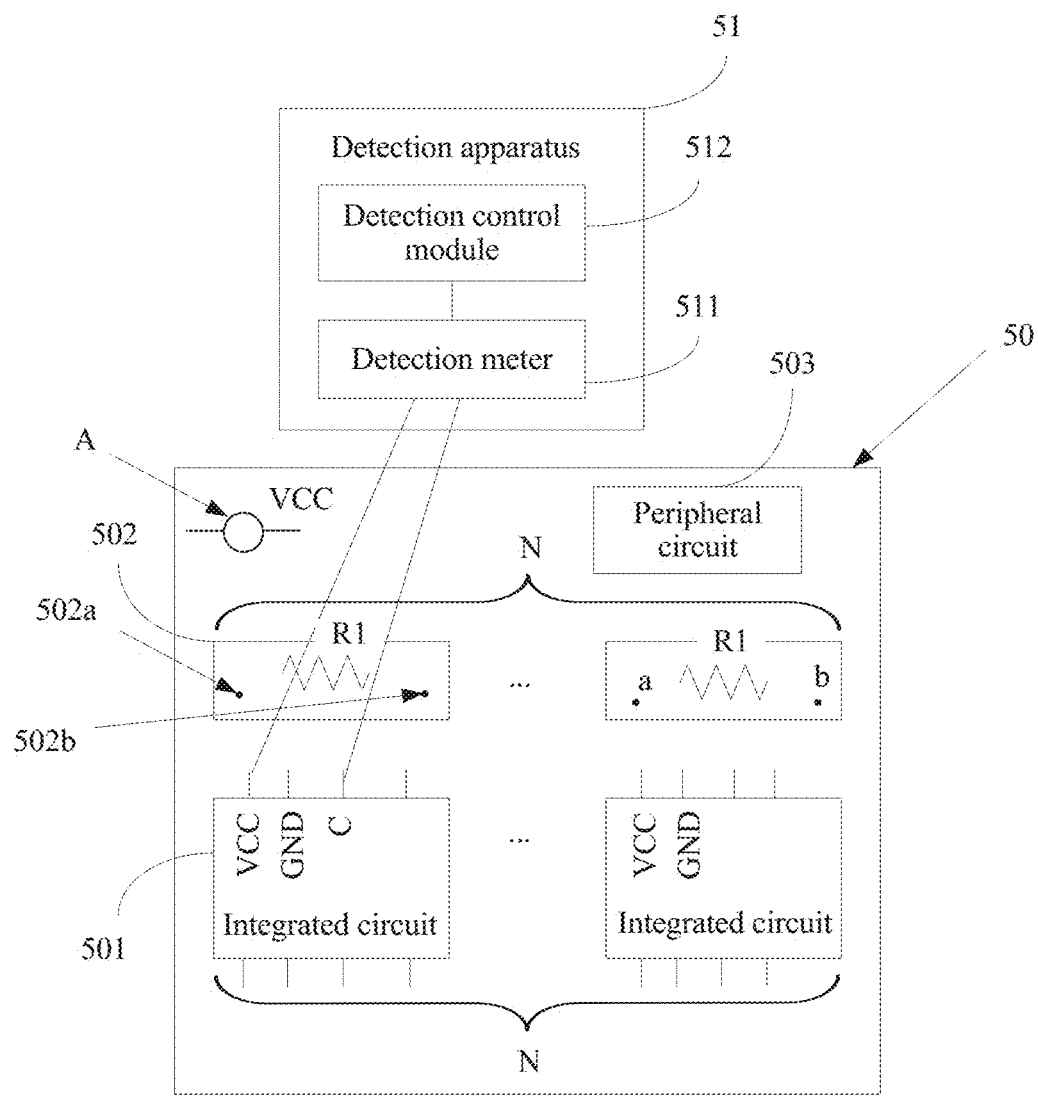
FIG. 10a is a schematic diagram of a specific detection system shown in FIG. 10 according to an embodiment of the present invention.

That is, as shown in FIG. 10a, the detection meter 511 is controlled to connect to the function pin C and the volt current condenser pin VCC that are of the first integrated circuit 501. FIG. 10a1 is a specific circuit diagram of the detection system shown in FIG. 10a.

Figure 10B:
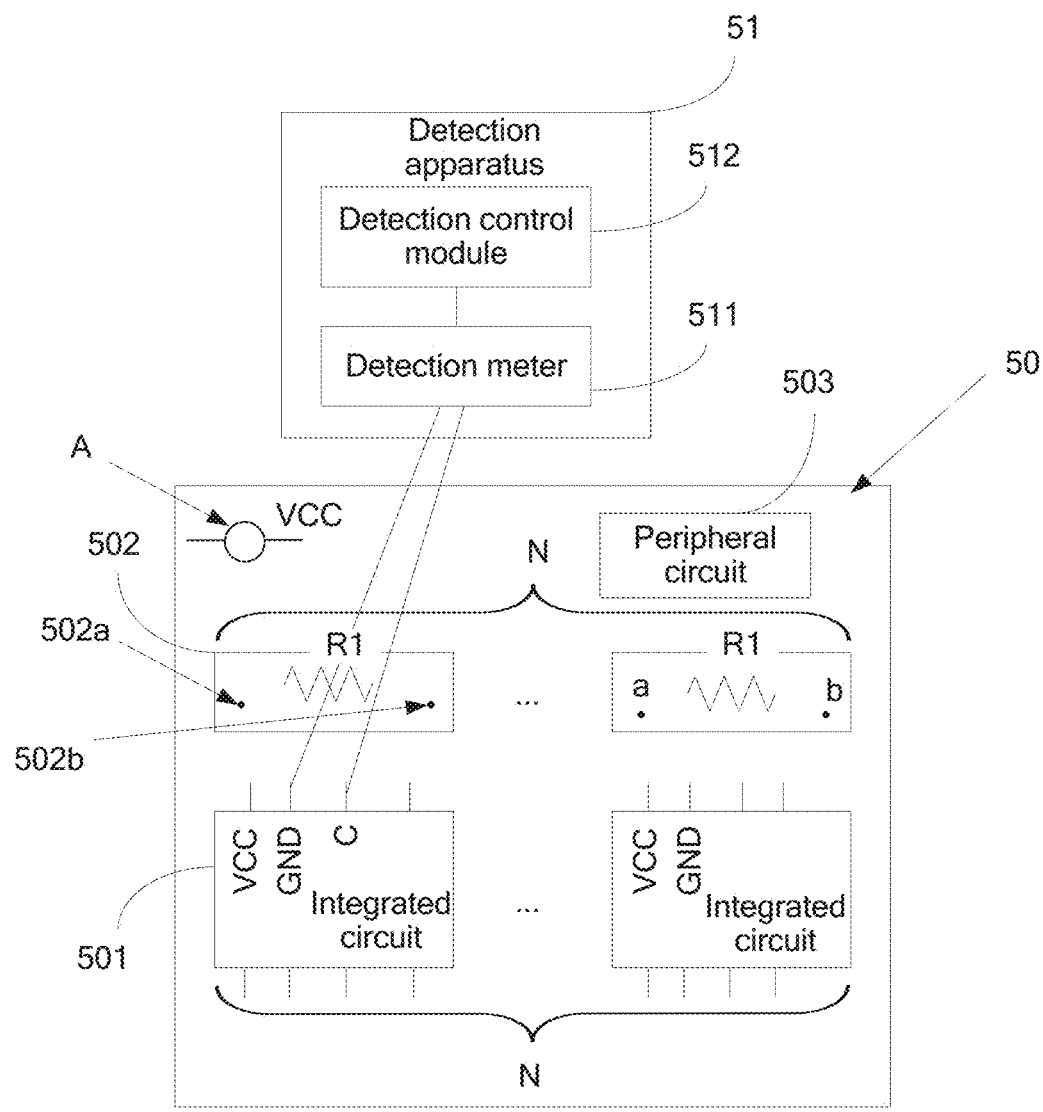
FIG. 10b is a schematic diagram of the specific detection system shown in FIG. 10 according to an embodiment of the present invention.

As shown in FIG. 10b, the detection meter 511 is controlled to connect to the function pin C and the ground pin that are of the integrated circuit 501. FIG. 10b1 is a specific circuit diagram of the detection system shown in FIG. 10b.

Step 404a: The detection meter detects the $n^{th}$ detection circuit to obtain a first detection result.

The detection meter detects, by using the detection circuit, an electrical parameter of the $n^{th}$ integrated circuit to obtain the first detection result. The first detection result includes the electrical parameter of the integrated circuit connected to the detection circuit, and the electrical parameter may include at least one of a total current, an on-resistance, a voltage, or another electrical parameter of the integrated circuit connected to the detection circuit.

Step 404b: The detection meter detects the $n^{th}$ integrated circuit to obtain a second detection result.

The detection meter first obtains detection results of the function pin and the volt current condenser pin that are of the $n^{th}$ integrated circuit and that are connected to the detection meter, then obtains detection results of the function pin and the ground pin that are of the $n^{th}$ integrated circuit and that are connected to the detection meter, and finally, comprehensively analyzes the detection results to obtain the second detection result. The second detection result includes an electrical parameter of the function pin of the integrated circuit, and the electrical parameter may include at least one of a total current, an on-resistance, a voltage, or another electrical parameter that is of the function pin of the integrated circuit.

Step 405: The data recording submodule reads the first detection result or the second detection result from the detection meter.

The data recording submodule may receive an instruction that is used for reading the first detection result or the second detection result and that is sent by the detection control module, and the data recording submodule reads the first detection result or the second detection result from the detection meter according to the instruction that is used for reading the first detection result or the second detection result.

Step 406: The data recording submodule stores the first detection result or the second detection result into the detection information table.

Step 407a: The data analysis submodule determines, according to the first detection result, whether an electrical parameter of the integrated circuit connected to the detection circuit is normal.

The data analysis submodule determines whether the first detection result is within a first preset range. The first preset range is a preset range of the electrical parameter of the integrated circuit connected to the detection circuit. If the first detection result is within the first preset range, step 408a is performed; or if the first detection result is not within the first preset range, step 409a is performed.

Step 407b: The data analysis submodule determines, according to the second detection result, whether an electrical parameter of the function pin of the integrated circuit is normal.

The data analysis submodule determines whether the second detection result is within a second preset range. The second preset range is a preset range of the electrical parameter of the function pin of the integrated circuit. If the second detection result is within the second preset range, step 408b is performed; or if the second detection result is not within the second preset range, step 409b is performed.

Step 408a: The data analysis submodule determines that the electrical parameter of the integrated circuit connected to the detection circuit is normal.

Step 409a: The data analysis submodule determines that the electrical parameter of the integrated circuit connected to the detection circuit is abnormal.

Step 408b: The data analysis submodule determines that the electrical parameter of the function pin of the integrated circuit is normal.

Step 409b: The data analysis submodule determines that the electrical parameter of the function pin of the integrated circuit is abnormal.

Step 4010: The warning submodule sends a warning prompt to user equipment.

The warning submodule sends, to the user equipment, the warning prompt of a detection result obtained by the data analysis submodule. The warning prompt may be automatically sent to a mailbox, a mobile phone, or another terminal by using a network. In addition, a link to a to-be-analyzed problem ticket that is automatically created is pushed to the terminal together with the warning prompt. If the to-be-analyzed problem ticket is not handled, the warning submodule automatically sends the warning prompt periodically according to a preset time.

Step 4011: The detection control module determines whether the $n^{th}$ integrated circuit is an $N^{th}$ integrated circuit.

If the $n^{th}$ integrated circuit is the $N^{th}$ integrated circuit, step 4012 is performed; or if $n^{th}$ integrated circuit is not the $N^{th}$ integrated circuit, step 4013 is performed.

Step 4012: The detection control module sets the detection meter to a non-detection state.

Step 4013: The detection control module controls the detection meter to connect to a first detection point and a second detection point that are of an $(n+1)^{th}$ detection circuit.

According to the integrated circuit detection method provided in this embodiment of the present invention, a detection apparatus detects, by using a detection circuit, an electrical parameter of an integrated circuit connected to the detection circuit, and a detection circuit connected to the integrated circuit on a printed circuit board is disposed on the printed circuit board, so as to determine, according to a first detection result, whether the electrical parameter of the integrated circuit connected to the detection circuit is normal; or the detection apparatus directly controls a detection meter to connect to a function pin and a volt current condenser pin that are of the integrated circuit, or to connect to a function pin and a ground pin that are of the integrated circuit for detecting an electrical parameter of the function pin of the integrated circuit, so as to determine, according to a second detection result, whether the electrical parameter of the function pin of the integrated circuit is normal. This overcomes a problem, in the prior art, that the electrical parameter of the integrated circuit on the printed circuit board cannot be detected when the printed circuit board is in a power-on state, so that the electrical parameter of the integrated circuit on the printed circuit board in the power-on state can be effectively detected.

It should be noted that integrated circuits on multiple printed circuit boards that are of a same model and of a same batch may be detected by using the integrated circuit detection method according to the present invention, so as to collect statistics on detection results of the same integrated circuits that are on the multiple printed circuit boards and that are obtained by detection, and to analyze whether any one of the integrated circuits on the printed circuit boards that are of the same model and of the same batch are abnormal. For example, one model-J integrated circuit is used on a printed circuit board A. in a process of processing 1000 printed circuit boards A of a same batch, because the model-J integrated circuit is located at the same position on each printed circuit board A, and peripheral circuits of the model-J integrated circuits are also the same, model-J integrated circuits with an abnormal electrical parameter may be identified by using methods such as a mean value method and a scatter chart and according to detection results of the 1000 model-J integrated circuits. Therefore, whether a potential quality problem occurs on model-J integrated circuits of a same batch or on an individual model-J integrated circuit can be identified according to a conclusion that is obtained by analyzing abnormal model-J integrated circuits. Likewise, if multiple model-J integrated circuits are used on the printed circuit board, abnormal model-J integrated circuits in different positions may be identified by using the method.

In particular, printed circuit boards of different batches and integrated circuits of different types can be analyzed together, so as to effectively identify a potential quality hazard caused by an abnormal electrical parameter of an integrated circuit. For example, one model-J integrated circuit is used on a printed circuit board A, two model-J integrated circuits are used in different positions of a printed circuit board B, and 1000 printed circuit boards A and 1000 printed circuit boards B are processed. Whether model-J integrated circuits in three positions are abnormal are separately determined first, and then three detection results are compared according to a preliminary conclusion, so as to analyze whether a model-J integrated circuit is abnormal. A conclusion obtained by using this method is more accurate than a conclusion that is obtained by means of identification based on a single position. Certainly, physical analysis may be further performed on an individual integrated circuit with an abnormal detection result, so as to determine whether a potential quality hazard exists in integrated circuits of a same batch.

Figure 11:
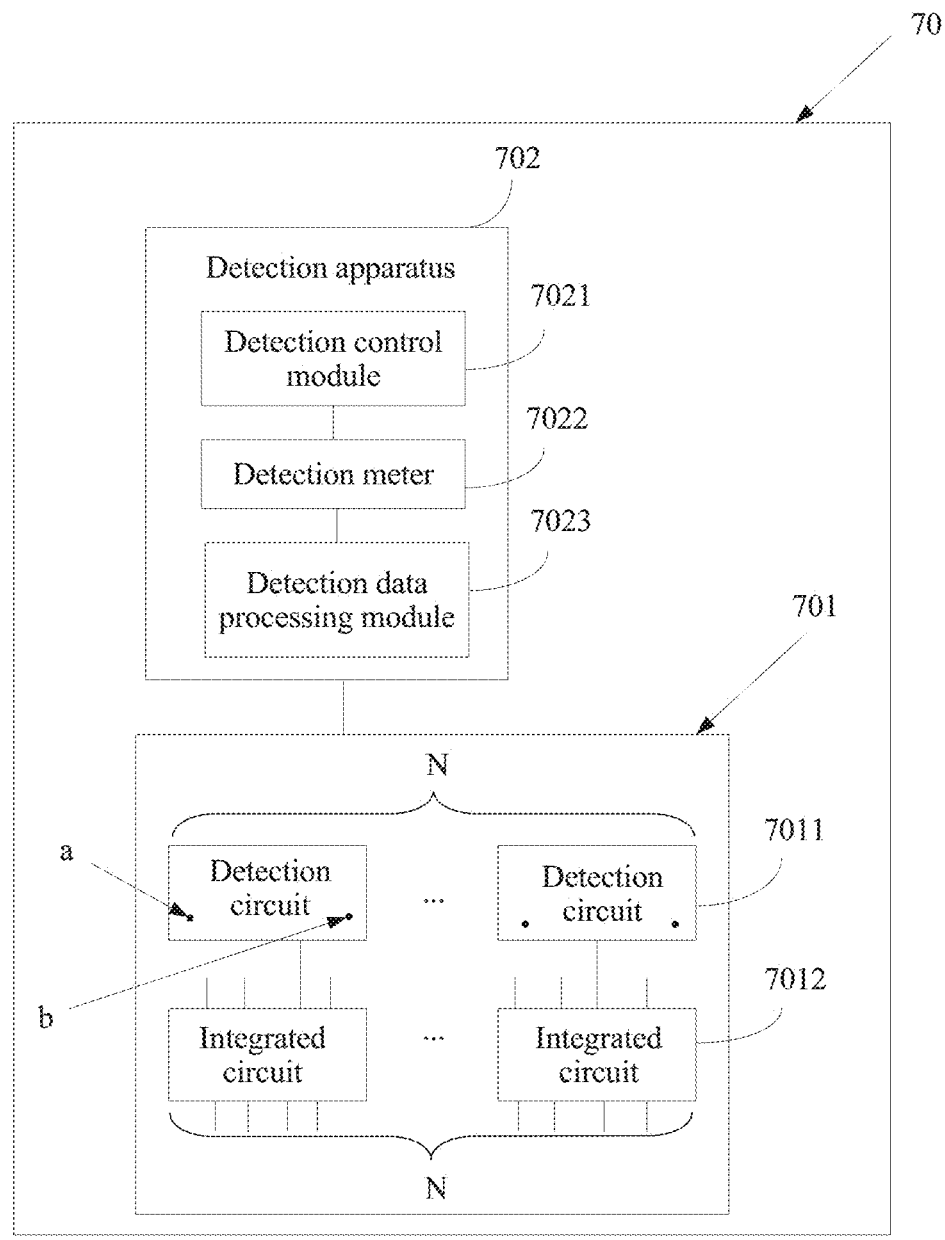
FIG. 11 is a schematic diagram of yet another detection system according to an embodiment of the present invention.

An embodiment of the present invention provides a detection system 70. As shown in FIG. 11, the detection system 70 includes a printed circuit board 701 and a detection apparatus 702.

The printed circuit board 701 includes N detection circuits 7011. Each detection circuit is connected to a different integrated circuit 7012. The detection circuit is provided with a first detection point a and a second detection point b, and the detection circuit is configured to detect an electrical parameter of the integrated circuit connected to the detection circuit. N is an integer greater than or equal to 1. The first detection point and the second detection point are connected to a detection meter that is configured to perform electrical parameter detection, so that the detection meter obtains a first electrical parameter by using the first detection point and the second detection point, and a detection data processing module determines, according to the first electrical parameter, whether the electrical parameter of the integrated circuit connected to the detection circuit is normal.

The detection apparatus 702 includes:

a detection control module 7021, configured to set a detection state of the detection meter, where the detection apparatus includes the detection meter; and the detection control module 7021 is further configured to control the detection meter to connect to the first detection point and the second detection point that are of the detection circuit on the printed circuit board in a power-on state, where the printed circuit board includes the N detection circuits, each detection circuit is connected to the different integrated circuit, the detection circuit is provided with the first detection point and the second detection point, and the detection circuit is configured to detect the electrical parameter of the integrated circuit connected to the detection circuit; and N is the integer greater than or equal to 1;

the detection meter 7022, configured to detect the detection circuit to obtain a first detection result, where the first detection result includes the electrical parameter of the integrated circuit connected to the detection circuit; and the detection data processing module 7023, configured to determine, according to the first detection result, whether the electrical parameter of the integrated circuit connected to the detection circuit is normal.

According to the integrated circuit detection method provided in this embodiment of the present invention, a detection apparatus detects, by using a detection circuit, an electrical parameter of an integrated circuit connected to the detection circuit, and a detection circuit connected to the integrated circuit on a printed circuit board is disposed on the printed circuit board, so as to determine, according to a first detection result, whether the electrical parameter of the integrated circuit connected to the detection circuit is normal; or the detection apparatus directly controls a detection meter to connect to a function pin and a volt current condenser pin that are of the integrated circuit, or to connect to a function pin and a around pin that are of the integrated circuit for detecting an electrical parameter of the function pin of the integrated circuit, so as to determine, according to a. second detection result, whether the electrical parameter of the function pin of the integrated circuit is normal. This overcomes a problem, in the prior art, that the electrical parameter of the integrated circuit on the printed circuit board cannot be detected when the printed circuit board is in a power-on state, so that the electrical parameter of the integrated circuit on the printed circuit board in the power-on state can be effectively detected.

It should be noted that, in the present invention, the power-on state includes a state in which the printed circuit board is powered on hut no service is running on the printed circuit board, and a state in which the printed circuit board is powered on and a service is running on the printed circuit board. In the present invention, the N detection circuits included in the printed circuit board may be the same or may be different, and each detection circuit is connected to the different integrated circuit.

In the present invention, the first detection result is a first electrical parameter, and the second detection result is a second electrical parameter.

Based on the foregoing embodiments, the electrical parameter includes at least one of a total current, an on-resistance, or a voltage. A preset range of the electrical parameter of the integrated circuit connected to the detection circuit is a range of an empirical value obtained when the integrated circuit operates on the printed circuit board, or a range of a mean value obtained by performing a test. A preset range of the electrical parameter of the function pin of the integrated circuit is a range of an empirical value obtained when the integrated circuit operates on the printed circuit board, or a range of a mean value obtained by performing a test.

The foregoing descriptions about implementation manners allow a person skilled in the art to understand that, for the purpose of convenient and brief description, division of the foregoing function modules is used as an example for illustration. In actual application, the foregoing functions can be allocated to different modules and implemented according to a requirement, that is, an inner structure of an apparatus is divided into different function modules to implement all or part of the functions described above. For a detailed working process of the foregoing system, apparatus, and unit, reference may be made to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the module or unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present invention essentially, or the part contributing to the prior art, or all or a part of the technical solutions may be implemented in the form of a software product. The software product is stored in a storage medium and includes several instructions for instructing a computer device (which may be a personal computer, a server, or a network device) or a processor to perform all or a part of the steps of the methods described in the embodiments of the present invention. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A printed circuit board, comprising:
one or more detection circuits, wherein each detection circuit is connected to a different integrated circuit, and at least one detection circuit is provided with a first detection point and a second detection point, wherein the first detection point and the second detection point are connected to a detection meter that is configured to perform electrical parameter detection, so that the detection meter obtains a first electrical parameter by using the first detection point and the second detection point, and determines, according to the first electrical parameter, whether an electrical parameter of the integrated circuit connected to the at least one detection circuit is normal, wherein the first detection point is connected to a volt current condenser of the printed circuit board that supplies power to the integrated circuit, and the second detection point is connected to a volt current condenser pin of the integrated circuit; and
and the electrical parameter comprises at least one of a total current, an on-resistance, or a voltage.

2. The printed circuit board according to claim 1, wherein the at least one detection circuit comprises at least one resistor, or at least one bead, or at least one inductor.

3. The printed circuit board according to claim 2, wherein when the at least one detection circuit comprises the at least one resistor, a first end of the at least one resistor is the first detection point, and a second end of the at least one resistor is the second detection point.

4. The printed circuit board according to claim 2, wherein
when the at least one detection circuit comprises the at least one bead, a first end of the at least one bead is the first detection point, and a second end of the at least one bead is the second detection point, and
when the at least one detection circuit comprises the at least one inductor, a first end of the at least one inductor is the first detection point, and a second end of the at least one inductor is the second detection point.

5. The printed circuit board according to claim 1, wherein the first detection point is connectable to a function pin of the integrated circuit, and the second detection point is connectable to a peripheral circuit of the integrated circuit.

6. A detection apparatus, comprising:
a detection meter configured to perform electrical parameter detection;
a detection data processing module; and
a detection control module configured to set a detection state of the detection meter and to control the detection meter to connect to a first detection point and a second detection point that are of a detection circuit on a printed circuit board in a power-on state, wherein the first detection point and the second detection point are connected to the detection meter and the first detection point is connected to a volt current condenser of the printed circuit board that supplies power to an integrated circuit, and the second detection point is connected to a volt current condenser pin of the integrated circuit,
wherein
the detection meter is configured to detect the detection circuit to obtain a first electrical parameter by using the first detection point and the second detection point, and the detection data processing module is configured to determine, according to the first electrical parameter, whether an electrical parameter of the integrated circuit connected to the detection circuit is normal, and
the first electrical parameter is the electrical parameter of the integrated circuit connected to the detection circuit.

7. The detection apparatus according to claim 6, wherein the detection data processing module is configured to:
determine whether the first electrical parameter is within a first preset range, wherein the first preset range is a preset range of the electrical parameter of the integrated circuit connected to the detection circuit; and when the first electrical parameter is within the first preset range, determine that the electrical parameter of the integrated circuit connected to the detection circuit is normal; or when the first electrical parameter is not within the first preset range, determine that the electrical parameter of the integrated circuit connected to the detection circuit is abnormal.

8. The detection apparatus according to claim 6, wherein:
the detection control module is further configured to:
control the detection meter to connect to a function pin and a volt current condenser pin that are of the integrated circuit, or control the detection meter to connect to a function pin and a ground pin that are of the integrated circuit;
the detection meter is further configured to detect the integrated circuit to obtain a second electrical parameter, wherein the second electrical parameter includes an electrical parameter of the function pin of the integrated circuit; and
the detection data processing module is further configured to determine, according to the second electrical parameter, whether the electrical parameter of the function pin of the integrated circuit is normal.

9. The detection apparatus according to claim 8, wherein the detection data processing module is configured to:
determine whether the second electrical parameter is within a second preset range, wherein the second preset range is a preset range of the electrical parameter of the function pin of the integrated circuit; and
when the second electrical parameter is within the second preset range, determine that the electrical parameter of the function pin of the integrated circuit is normal; or
when the second electrical parameter is not within the second preset range, determine that the electrical parameter of the function pin of the integrated circuit is abnormal.

10. The detection apparatus according to claim 6, wherein the electrical parameter comprises at least one of a total current, an on-resistance, or a voltage.

11. A detection system, comprising:
a detection apparatus comprising:
a detection meter configured to perform electrical parameter detection,
a detection data processing module, and
a detection control module configured to set a detection state of the detection meter and to control the detection meter to connect to a first detection point and a second detection point that are of a first detection circuit on a printed circuit board in a power-on state, wherein the first detection point and the second detection point are connected to the detection meter, wherein
the detection meter is configured to detect the first detection circuit to obtain a first electrical parameter by using the first detection point and the second detection point, and the detection data processing module is configured to determine, according to the first electrical parameter, whether an electrical parameter of an integrated circuit connected to the first detection circuit is normal, and
the first electrical parameter is the electrical parameter of the integrated circuit connected to the first detection circuit and comprises at least one of a total current an on-resistance, or a voltage; and the printed circuit board comprising:
one or more detection circuits including the first detection circuit, wherein each of the one or more detection circuits is connected to a different integrated circuit, and the first detection circuit is provided with the first detection point and the second detection point, the first detection point being connected to a volt current condenser of the printed circuit board that supplies power to an integrated circuit, and the second detection point being connected to a volt current condenser pin of the integrated circuit.

12. The detection system according to claim 11, wherein the first detection circuit comprises at least one resistor, or at least one bead, or at least one inductor.

13. The detection system according to claim 12, wherein when the first detection circuit comprises the at least one resistor, a first end of the at least one resistor is the first detection point, and a second end of the at least one resistor is the second detection point.

14. The detection system according to claim 12, wherein
when the first detection circuit comprises the at least one bead, a first end of the at least one bead is the first detection point, and a second end of the at least one bead is the second detection point, and
when the first detection circuit comprises the at least one inductor, a first end of the at least one inductor is the first detection point, and a second end of the at least one inductor is the second detection point.

15. The detection system according to claim 11, wherein the detection data processing module is configured to:
determine whether the first electrical parameter is within a first preset range, wherein the first preset range is a preset range of the electrical parameter of the integrated circuit connected to the first detection circuit; and
when the first electrical parameter is within the first preset range, determine that the electrical parameter of the integrated circuit connected to the first detection circuit is normal; or
when the first electrical parameter is not within the first preset range, determine that the electrical parameter of the integrated circuit connected to the first detection circuit is abnormal.

16. The detection system according to claim 11, the detection control module is further configured to: control the detection meter to connect to a function pin and a volt current condenser pin that are of the integrated circuit, or control the detection meter to connect to a function pin and a ground pin that are of the integrated circuit;
the detection meter is further configured to detect the integrated circuit to obtain a second electrical parameter, wherein the second electrical parameter includes an electrical parameter of the function pin of the integrated circuit; and
the detection data processing module is further configured to determine, according to the second electrical parameter, whether the electrical parameter of the function pin of the integrated circuit is normal.

17. The detection system according to claim 16, wherein the detection data processing module is configured to:
determine whether the second electrical parameter is within a second preset range, wherein the second preset range is a preset range of the electrical parameter of the function pin of the integrated circuit; and
when the second electrical parameter is within the second preset range, determine that the electrical parameter of the function pin of the integrated circuit is normal; or when the second electrical parameter is not within the second preset range, determine that the electrical parameter of the function pin of the integrated circuit is abnormal.

18. The detection system according to claim 11, wherein the electrical parameter comprises at least one of a total current, an on-resistance, or a voltage.

19. The detection system according to claim 11, wherein the first detection point is connectable to a function pin of the integrated circuit, and the second detection point is connectable to a peripheral circuit of the integrated circuit.

* * * * *